(12) United States Patent
Shaw et al.

(10) Patent No.: US 9,188,683 B2
(45) Date of Patent: Nov. 17, 2015

(54) ENCAPSULATED PHOTOMULTIPLIER DEVICE OF SEMICONDUCTOR MATERIAL, FOR USE, FOR EXAMPLE, IN MACHINES FOR PERFORMING POSITRON-EMISSION TOMOGRAPHY

(75) Inventors: Mark Andrew Shaw, Milan (IT); Federico Giovanni Ziglioli, Pozzo D'Adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 457 days.

(21) Appl. No.: 13/303,731

(22) Filed: Nov. 23, 2011

(65) Prior Publication Data

US 2012/0132817 A1 May 31, 2012

(30) Foreign Application Priority Data

Nov. 29, 2010 (IT) .............................. TO2010A0947

(51) Int. Cl.
  *G01T 1/20* (2006.01)
  *H01L 27/146* (2006.01)

(52) U.S. Cl.
  CPC ......... *G01T 1/2018* (2013.01); *H01L 27/14658* (2013.01); *H01L 2224/48091* (2013.01); *H01L 2224/73265* (2013.01)

(58) Field of Classification Search
  CPC .................... H01L 23/49822; H01L 21/4803; H01L 27/00; H01L 2221/10; H01L 23/53295; H01L 31/00; H01L 2031/00; H01L 23/5329; H01L 23/522; H01L 23/52
  USPC ....................................................... 257/186
  See application file for complete search history.

(56) References Cited

U.S. PATENT DOCUMENTS

| | | | | |
|---|---|---|---|---|
| 6,952,003 | B2* | 10/2005 | Skurnik et al. ............. | 250/208.2 |
| 2004/0135121 | A1* | 7/2004 | Toyoda et al. ........... | 252/301.16 |
| 2007/0155033 | A1* | 7/2007 | Kim et al. ........................ | 438/27 |
| 2008/0170396 | A1* | 7/2008 | Yuan et al. .................... | 362/244 |
| 2008/0284003 | A1* | 11/2008 | Kwang et al. ................. | 257/724 |
| 2009/0020774 | A1* | 1/2009 | Park ............................... | 257/98 |

(Continued)

FOREIGN PATENT DOCUMENTS

| GB | 2451447 | | 2/2009 |
|---|---|---|---|
| JP | 06-051068 | * | 2/1994 |

OTHER PUBLICATIONS

Dow Corning OE-6635 Product Information, published Nov. 10, 2008.*

(Continued)

*Primary Examiner* — Yara B Green
(74) *Attorney, Agent, or Firm* — Seed IP Law Group PLLC

(57) ABSTRACT

An embodiment of a photomultiplier device is formed by a base substrate of insulating organic material forming a plurality of conductive paths and carrying a plurality of chips of semiconductor material. Each chip integrates a plurality of photon detecting elements, such as Geiger-mode avalanche diodes, and is bonded on a first side of the base substrate. Couplings for photon-counting and image-reconstruction units are formed on a second side of the base substrate. The first side of the base substrate is covered with a transparent encapsulating layer of silicone resin, which, together with the base substrate, bestows stiffness on the photomultiplier device, preventing warpage, and covers and protects the chips.

39 Claims, 10 Drawing Sheets

(56) References Cited

U.S. PATENT DOCUMENTS

| | | | |
|---|---|---|---|
| 2009/0062658 A1* | 3/2009 | Dunki-Jacobs et al. | 600/476 |
| 2009/0114937 A1* | 5/2009 | Kawakubo | 257/98 |
| 2009/0184317 A1 | 7/2009 | Sanfilippo et al. | |
| 2009/0184384 A1 | 7/2009 | Sanfilippo et al. | |
| 2011/0079801 A1* | 4/2011 | Zhang et al. | 257/98 |
| 2011/0291017 A1* | 12/2011 | Frach | 250/366 |
| 2012/0238051 A1* | 9/2012 | Park | 438/73 |

OTHER PUBLICATIONS

Dow Corning Press Release, "HRI Silicone Encapsulants to optimize LED Performance," published Oct. 29, 2007. Url <http://news.thomasnet.com/fullstory/HRI-Silicone-Encapsulants-optimize-LED-performance-534864>.*

Pestotnik et al (2008) "Silicon Photo-multipliers as Photon Detector for PET"; 2008 IEEE Nuclear Science Symposium Conference Record; 5 pages.

Heckathorne et al (2008) "Evaluation of Arrays of Silicon Photomultipliers for Beta Imaging"; 2008 IEEE Nuclear Science Symposium Conference Record; 6 pages.

Search Report for Italian Patent Application No. TO20100947, Ministero Dello Sviluppo Economico, The Haughe, Nov. 2, 2011, pp. 2.

* cited by examiner

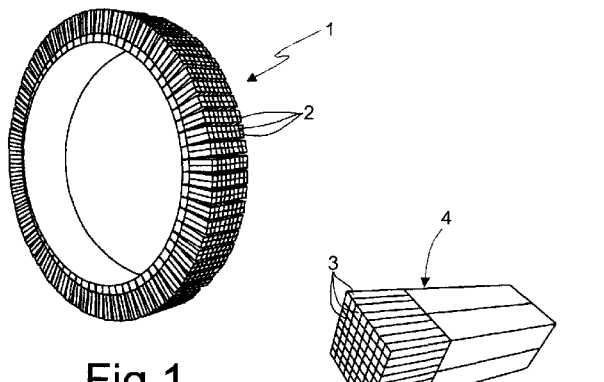
Fig.1
Fig.2
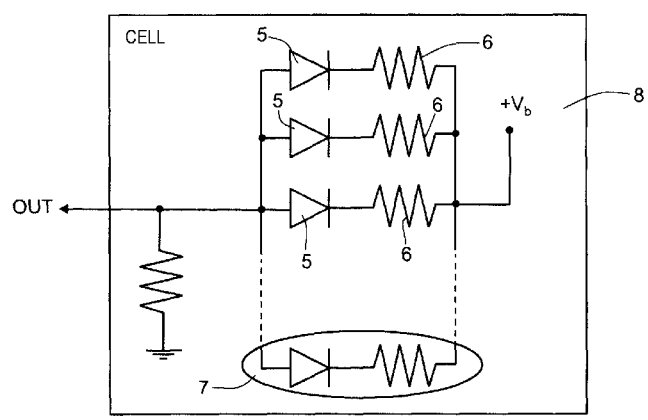
Fig.3

ENCAPSULATED PHOTOMULTIPLIER DEVICE OF SEMICONDUCTOR MATERIAL, FOR USE, FOR EXAMPLE, IN MACHINES FOR PERFORMING POSITRON-EMISSION TOMOGRAPHY

PRIORITY CLAIM

The instant application claims priority to Italian Patent Application No. TO2010A000947, filed Nov. 29, 2010, which application is incorporated herein by reference in its entirety.

TECHNICAL FIELD

An embodiment relates to a photomultiplier device of semiconductor material, in particular for use in machines for performing positron-emission tomography (PET).

BACKGROUND

As is known, positron-emission tomography (PET) is widely used, i.e., in the medical sector for the detection of structures and formations in human tissues, and consists in supplying a tracer isotope bound to an active molecule to tissues to be examined. The decay of the isotope in the tissues causes generation of positrons that are annihilated with electrons and give rise to gamma rays, which can be detected by a layer of inorganic crystals (scintillator) where a flash is created, which is in turn detected by a photomultiplication structure arranged adjacent to the layer of inorganic crystals.

For example, FIG. 1 shows a typical detector ring 1 present in a PET machine. As may be noted, the detector ring 1 is formed by a plurality of detector blocks 2, circumferentially arranged around the ring, each with radial extension. Referring to FIG. 2, each detector block 2 includes an array of inorganic crystals or scintillators 3 adjacent to an array of photomultipliers 4.

Traditionally, the photomultipliers 4 are formed by photomultiplier tubes (PMTS); however, in the last few years, the use of silicon photomultipliers (SiPms) has been proposed, thanks to the high efficiency that can be obtained (see, for example, "Silicon Photo-multipliers as Photon Detector for PET", by R. Pestotnik et al., 2008 IEEE Nuclear Science Symposium Conference Record, which is incorporated by reference).

The proposed SiPms are formed as arrays of individual photomultiplier cells, each made up of a plurality of elements for detecting individual photons, typically Geiger-mode avalanche diodes (GMAPs), made, for example, as described in US 2009-0184317 and US 2009-0184384, which are incorporated by reference. In particular, the avalanche diodes operate at reverse biasing voltages that are a few volts higher than the breakdown voltage, and each avalanche diode detects an individual photon. In fact, as shown in FIG. 3, each avalanche diode 5 is coupled to the supply Vb through a respective quenching resistor 6, disposed (e.g., integrated) in series, and forms with the latter a pixel 7. In each pixel 7, the quenching resistor 6 is able to quench the avalanche current and reset only the relevant avalanche diode 5 after detection of a photon. In a photomultiplier cell 8, the pixels 7 are coupled in parallel to one another so that the currents detected by each of the individual pixels 7 are added together. The intensity of the total current of the photomultiplier cell 8 is thus given by the analog superposition of the signals (binary signals in an embodiment) produced by all activated pixels 7, which is, in turn, proportional to the number of incident photons (to a first approximation, if multiple hits on different pixels 7 are neglected).

Thus, in case of weak flows of photons, a photomultiplier cell 8 of SiPm diodes behaves as an analog or proportional device, whereas the individual pixels operate in digital or Geiger mode. For this reason, silicon photomultipliers are also frequently represented as digital-to-analog conversion devices.

Currently, in general, each photomultiplier cell is manufactured in a chip with dimensions of approximately 4×4 $mm^2$, or, at the most, approximately 5×5 $mm^2$, and the various chips are arranged near each other so as to form more extensive detection surfaces. In particular, the chips are bonded to an intermediate substrate (generally a die of semiconductor material), which is, in turn, bonded to a base substrate, which is larger and is generally obtained from a printed circuit board (PCB) or from PCB material. The group formed by the base substrate, the intermediate substrate, and the array of cells is then bonded to the array of scintillators 3, for example, with the interposition of an optical grease (see, for example, "Evaluation of Arrays of Silicon Photomultipliers for Beta Imaging", E. Heckathorne, L. Tiefer, F. Daghighian, M. Dahlborn, 2008 IEEE Nuclear Science Symposium Conference Record, which is incorporated by reference).

However, arranging the cells near each other typically requires the presence of free areas for providing the connections (paths, pads for the connection wires, etc.). In at least some known devices, for example, the active areas represent approximately 50-60% of the total area. Consequently, there are "dead" or "blind" areas with no pixels, where, consequently, photons are lost. This entails a reduction in the theoretical resolution of the PET, and may entail a lengthening of the times for carrying out the medical examination.

This problem may increase when the single chips that integrate a cell are bonded to an own intermediate substrate, on account of the tolerance of bonding the intermediate substrates.

Attempts at directly bonding the chips to the base substrate have not solved the problem since the structure tends to undergo deformation and to lose planarity (i.e., warp), because of the large dimensions of the base substrate, of the layer of cement used, and of the bonding process, thus preventing proper contact between the photomultipliers and the photomultiplier cells, and thus worsening the detection efficiency.

It is also possible to reduce the dead spaces by providing through silicon vias (TSVs) through the base substrate and through the intermediate substrate, when present, but this solution typically does not solve the problem of warpage, and may be costly.

On the other hand, the creation of the array of cells in a single integrated device, for example, of approximately 32×32 $mm^2$, gives rise to problems of yield, and also devices of these dimensions tend to undergo considerable deformation due to stress. In addition, also in this case it would probably be necessary to create through vias through the base substrate, with all the problems highlighted above.

On the other hand, the lack of an effective protection of the chips is a problem since bonding the array of photomultiplier cells to the array of scintillators is generally performed in a plant remote from the site where the photomultiplier devices are produced.

SUMMARY

An embodiment is a photomultiplier device that overcomes one or more drawbacks of the prior art.

BRIEF DESCRIPTION OF THE DRAWINGS

For a better understanding of the concepts disclosed herein, one or more embodiments are now described, purely by way of non-limiting example, with reference to the attached drawings, wherein:

FIG. 1 is a perspective view of a ring of detectors used for performing a PET;

FIG. 2 is a perspective view of a detector block in the ring of FIG. 1;

FIG. 3 is a schematic diagram of the equivalent electrical circuit of a semiconductor photomultiplier cell that can be used in the detector block of FIG. 2;

DETAILED DESCRIPTION

Figure 4:
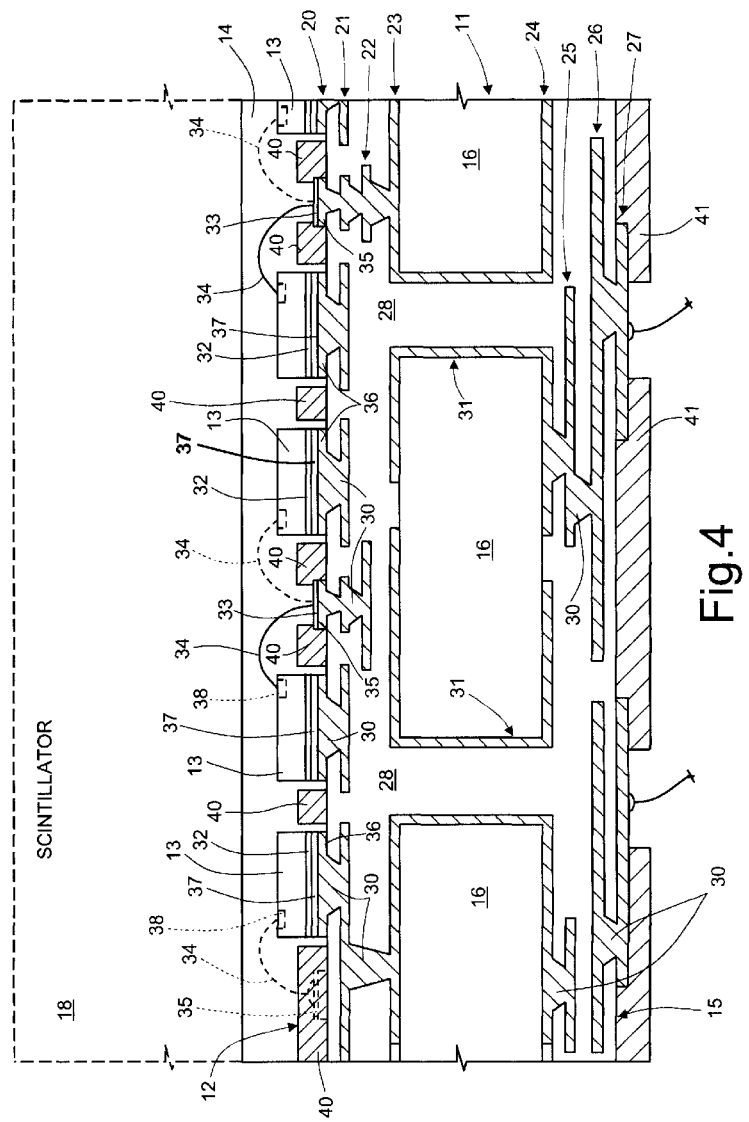
FIG. 4 shows a cross-section through an embodiment of an encapsulated photomultiplier device.

FIG. 4 shows a cross-section through a photomultiplier device 10 according to an embodiment. The photomultiplier device 10 includes a base substrate 11 having one side, designated by way of example, as front side 12, bonded to an array of chips 13, each forming a photomultiplier cell 8 of the type shown in FIG. 3 and thus including a plurality of photon detecting elements of semiconductor material, typically Geiger-mode avalanche diodes. The chips 13 are covered by an encapsulating layer 14 that is to be bonded to a scintillator crystal 18 represented with a dashed line. A second side of the base substrate 11, designated as rear side 15, is used for coupling to the "outside world."

The base substrate 11 may be an organic substrate made up of one or more core layers 16 of insulating material, typically plastic, in particular an epoxy resin, and specifically a laminate of BT (bismaleimide triazine) or FR-4 or some other material used for forming printed circuits.

On the two sides of the core layer 16 coupling structures are present. In the example shown, the coupling structures are formed by eight conductive levels or layers 20-27, four to each side of the core layer 16, separated from one another by layers of dielectric material designated as a whole by 28, and coupled where envisaged by interlevel conductive vias 30 and by through conductive vias 31 (two whereof are visible in FIG. 4). In detail, the example shown includes the following conductive levels 20-27 (in sequence, starting from the front side):

chip coupling level 20 on the front side 12 of the substrate, forming both wire-bonding pads 35 and upper pads 36;

first shielding level 21, which shields the chips 13 from the underlying coupling level. This level, like the similar shielding levels described below, extends through most the area of the photomultiplier device 10 and is interrupted only to ensure electrical separation of the various current paths;

first routing level 22, formed by a plurality of conductive paths which couple the underlying levels to the pads 35 and 36;

second shielding level 23, which is adjacent to the top side of the core layer 16 and shields the first routing level underneath;

third shielding level 24, adjacent to the lower side of the core layer 16; this level may be omitted, but it may be useful for the symmetry of the structure;

second routing level 25, formed by a respective plurality of conductive paths so as to allow, together with the first routing level, crossing of the various current paths and coupling the conductive regions of the third shielding level 24 to the points provided for the external couplings;

fourth shielding level 26, for shielding the second routing level 25 at the bottom; and external coupling level 27 forming a plurality of external pads, for enabling coupling of the photomultiplier device 10 to the signal-processing units of an image-detecting system, for example of a PET machine.

The conductive levels 20-27 and the dielectric layers 28 may be obtained in a conventional manner employing conventional techniques for manufacturing printed-circuit boards. For example, in an embodiment, the conductive levels 20-27 are made of copper, and the dielectric layers 28 are made of organic material, such as bismaleide triazine (BT).

The thickness of the base substrate 11 is selected so as to bestow on the photomultiplier device 10, together with the encapsulating layer 14, the desired stiffness; for example, the thickness can be approximately between 0.5 and 1.5 mm. In addition, the core layer 16 can have a thickness of approximately 400-600 µm, e.g., approximately 0.5 mm; the conductive levels can have each a thickness between approximately 15 and 20 µm, e.g., approximately 20 µm; and the dielectric layers 28 can have a thickness of between approximately 30 and 40 µm, e.g., approximately 30 µm, so as to obtain a total minimum thickness greater than approximately 800 µm, for example, greater than approximately 900 µm, e.g., approximately 920 µm. In general, the base substrate 11 has a maximum thickness of between 0.5 approximately and 1.5 mm.

The interlevel conductive vias 30 are made, for example, of copper deposited in openings in the dielectric layers; the through conductive vias 31 are formed by a metal layer covering holes extending through the core layer 16 and filled with dielectric material.

The wire-bonding pads 35 formed in the chip coupling level 20 are covered with a bonding layer 33 of gold or other material suitable for coupling with bonding wires 34; the latter are also coupled each to a respective chip pad 38 provided on a front surface of each chip 13. Each chip 13 moreover has a rear surface covered with a metal layer 32, for example, of Cr—Ni—Au, bonded to a respective pad 36 via conductive adhesive regions 37 formed by a layer referred to also as "conductive die-attach film" (CDAF). For example, the conductive adhesive layer 37 can be product LE5000 manufactured by Lintec Corporation, with a thickness of approximately 15-50 µm.

A front solder-mask layer 40 and a rear solder-mask layer 41 completely cover respectively the chip coupling level 20 (except at the wire-bonding pads 35 and the upper pads 36) and the external coupling level 27 (except at external pads in the external coupling level 27), respectively. The front and rear solder-mask layers 40, 41 are of a non-conductive material, which can be patterned via chemical etching. For example, the non-conductive material may be a polymeric material, such as AUS 308 manufactured by Taiyo America, Inc.

The encapsulating layer 14 extends above the front solder-mask layer 40 and alongside the latter where it is open for the contacts. The encapsulating layer 14 has the purpose of encapsulating the photomultiplier device 10, forming a protection structure for the chips 13 during transport, storage, and handling. The encapsulating layer 14 has also a stiffening function, such as to bestow, together with the base substrate 11, the desired stiffness to the photomultiplier device 10, preventing warpage thereof, which, in addition to jeopardizing proper operation of the photomultiplier device 10, may prevent bonding thereof to the scintillator crystal 18. In order to enable functionality of the photomultiplier device 10, the encapsulating layer 14 has a relatively high transparency, for example, higher than 90% at the operating wavelengths of the apparatus wherein the photomultiplier device 10 is mounted. For example, for application in machines for PET, the working wavelength is approximately within the 400-to-800-nm band.

In the example considered, the encapsulating layer 14 is a non-dispensable, transparent (in the sense defined above) silicone resin, having a relatively low Young's modulus that enables compensation for minor warpage. For example, the Young's modulus may be between approximately 2 MPa and 10 MPa.

For example, the encapsulating layer 14 may be a layer that can be applied by liquid compression moulding, such as OE-6635A/B manufactured by DOW CORNING™ or LPS3412 and LPS5400 manufactured by SHIN-ETSU™.

The encapsulating layer 14 typically has a thickness between approximately 100 and 250 µm, for example, approximately 150-200 µm, above the chips 13, i.e., between approximately 150 and 600 µm, for example, approximately between 400 and 450 µm, starting from the surface of the base substrate 11, and more precisely from the solder-mask layer 40. In this way, with chips 13 of a height of approximately 250 µm (the bottom base whereof is approximately aligned with the top surface of the solder-mask layer 40) and bonding wires 34 projecting approximately 100 µm above the chips (i.e., with a wire-bonding loop of approximately 100 µm) the space above the bonding wires 34 is approximately 50-100 µm. Since the encapsulating layer 14 can be moulded with high planarity of the top surface, it can be bonded directly to the scintillator crystal 18, without any need to interpose glue layers, thus improving the transparency and avoiding the corresponding cost.

An embodiment of a process for manufacturing an embodiment of the photomultiplier device 10 includes forming the base substrate 11 according to known techniques for producing printed circuits, and includes:

covering the top side and the bottom side of the core layer 16 with a conductive layer (for example, via lamination of a copper layer or by sputtering and subsequent electrolytic or electroless plating with copper) so as to form the second and third shielding levels 23, 24;

perforating the core layer 16 (using a purposely provided perforating tool, such as a microdrill) and covering the walls of the holes (for example, via plating with metal material, for example copper, or sputtering);

etching and patterning the second and third shielding levels 23, 24 according to the desired paths;

filling the holes with dielectric material;

creating the sequence of insulating layers and conductive levels 20-22 and 25-27, with formation of the interlevel conductive vias 30 and the vias 31, in a conventional manner;

plating the wire-bonding pads 35 and the upper pads 36, for example with gold; and depositing and patterning the solder-mask layers 40, 41 so as to free the pads.

Then, the individual chips 13 are bonded on the upper pads 36 via the interposition of the conductive adhesive regions 37, which may be pre-applied on the photomultiplier devices 10 at the wafer level before dicing. The wire connections are obtained by bonding the bonding wires 34 between the chips 13 and the corresponding wire-bonding pads 35, and then the encapsulating layer 14 is moulded over an entire wafer. For this purpose, a wafer including a plurality of base substrates 11 and of the corresponding chips 13 is introduced in a half-mould. The encapsulating material is deposited in the half-liquid phase in the other half-mould, and the two half-moulds are closed. Then a thermal curing step is performed, for example, for approximately 100-300 s at approximately 150-220° C. Finally, the wafer thus obtained is diced to obtain the individual photomultiplier devices 10, with the encapsulating layer 14 that covers the chips 13 at the top and laterally, so protecting them.

Figure 5:
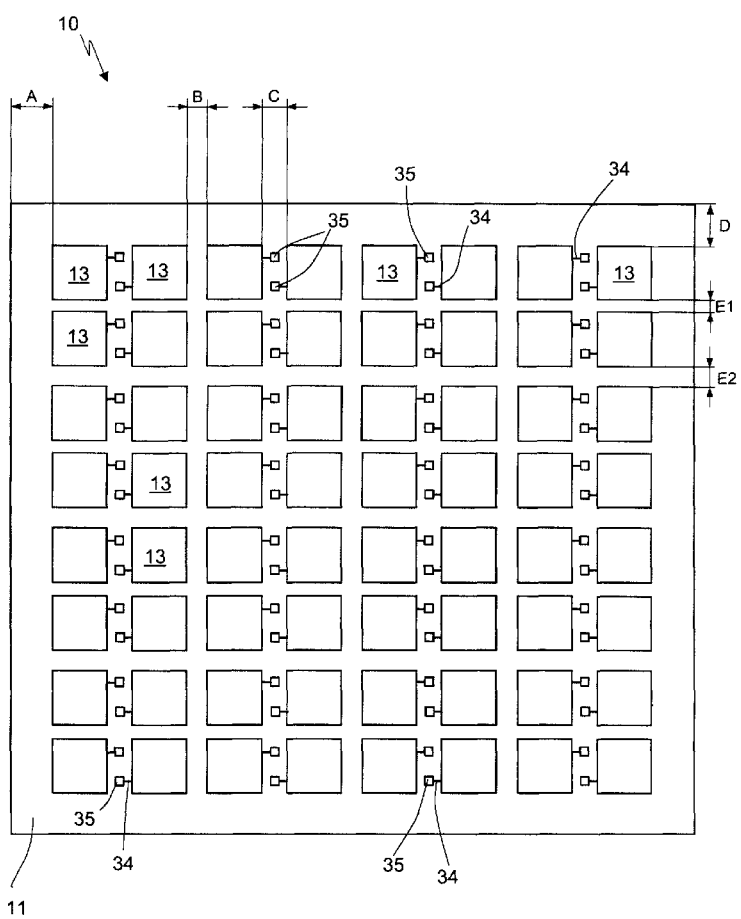
FIG. 5 shows a possible layout of the encapsulated photomultiplier device of FIG. 4 according to an embodiment.

FIG. 5 shows a layout of the photomultiplier device 10 of FIG. 4 according to an embodiment. Here, the photomultiplier device 10 includes 8×8 chips 13, aligned in an array of rows and columns, with wire-bonding pads 35 arranged between the first and the second columns, between the third and the fourth columns, between the fifth and the sixth columns, and between the seventh and the eighth columns. In particular, the two wire-bonding pads 35 arranged between two adjacent chips in the direction of the rows are staggered with respect to each other in the direction of the columns so as to reduce the overall dimensions.

With the above arrangement, for placing the chips 13, it may be possible to create a single reference ("fiducial") 39 every four chips, in a position facing four adjacent corners of the four chips 13.

Consequently, with chips of dimensions of approximately 3.95×3.95 mm$^2$, side edge A, D 250 µm, distance between columns without pad B≈120 µm, distance between columns with pad C≈150 µm, distance between rows of chips referred to a same reference 39 E1≈80 µm, distance between rows of chips referred to different references 39 E2≈120 µm, the total area of the photomultiplier device 10 is approximately 115.284 mm$^2$ and the active surface is approximately 88.5% of the area of the photomultiplier device 10.

Figure 6:
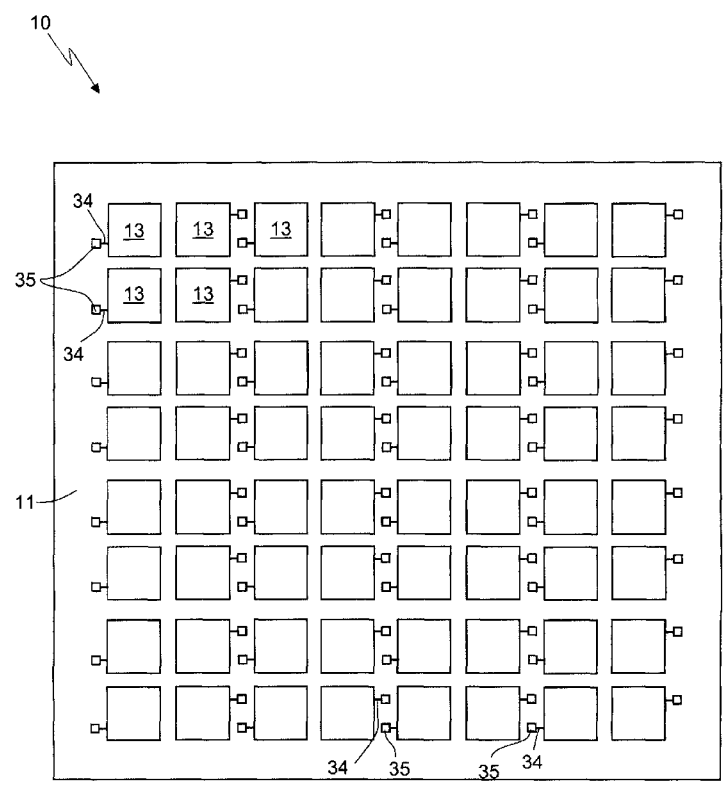
FIG. 6 shows another possible layout of the encapsulated photomultiplier device of FIG. 4 according to an embodiment.

FIG. 6 shows a different layout according to an embodiment, wherein the wire-bonding pads 35 are arranged on the left side of the first column, between the second and the third columns, between the fourth and the fifth columns, between the sixth and the seventh columns, and to the right of the eighth column. In this case, with a side edge A of approximately 350 μm and all the other dimensions being approximately the same as described above in conjunction with FIG. 5, the active surface is approximately 88% of the area of the photomultiplier device 10.

Figure 7:
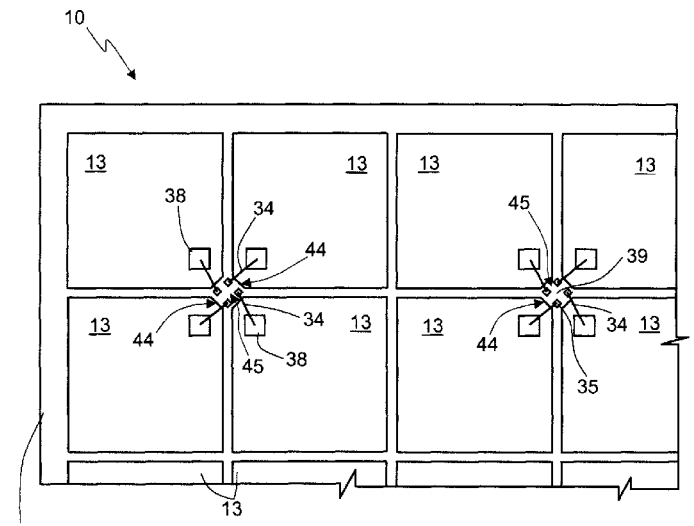
FIG. 7 shows a portion of a further possible layout of the encapsulated photomultiplier device of FIG. 4 according to an embodiment.

FIG. 7 shows a part of a different embodiment, wherein the chips 13 still have a square or rectangular base, but have a bevelled corner 44. By arranging four chips 13 with the bevelled corners 44 facing one another, an area 45 is formed where it may be possible to provide four wire-bonding pads 35, one for each chip 13 that faces the area 45. Also arranged at the center of each area 45 is a reference 39. In this way, it may be possible to position and align the chips 13 with high precision and ensure an extensive active area. For the remaining portions of the device 10, the cross-section of the photomultiplier device 10 is approximately the same as illustrated in FIG. 4. In this case, each chip loses an area of approximately 0.78 mm$^2$ on account of the bevelled corner 44, but it may be possible to arrange the chips at a constant distance both in the rows and in the columns. In this case, an occupation of area of approximately 93% may be obtained.

The chamfer 44 can be obtained easily in the dicing step via laser techniques, and the chamfer may also present different shapes, such as that of the arc of a circumference so as to define as a whole a circular area, or an area having some other regular or irregular geometrical shape, for bonding.

Figure 8:
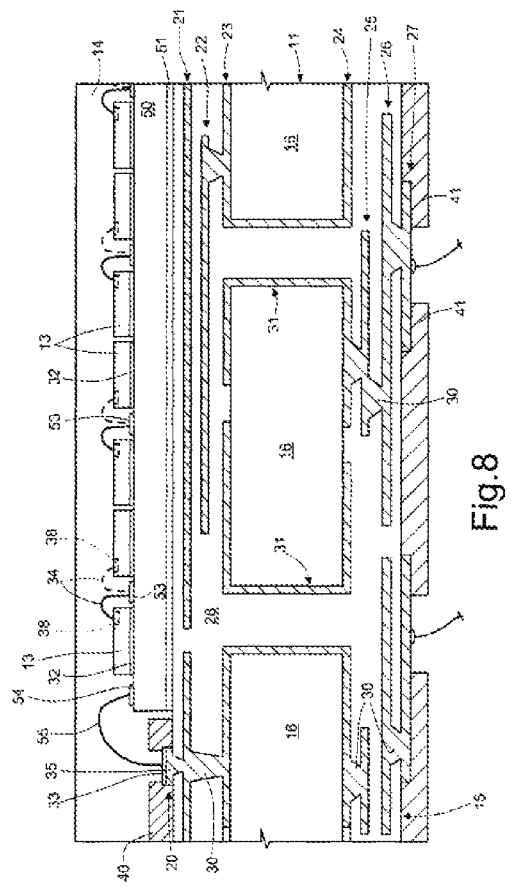
FIG. 8 shows a cross-section through a different embodiment of a photomultiplier device.

FIG. 8 is a cross section of a device 10 according to an embodiment including an intermediate substrate 50, of semiconductor material (silicon), bonded to the base substrate 11 through an insulating adhesive layer 51, in a conventional manner. Bonding wires 34 couple the chip pads 38 to respective intermediate pads 53 on the intermediate substrate 50. In addition, in a way similar to FIG. 4, each chip 13 has a metal layer 32 bonded to corresponding pads (not shown) via respective conductive adhesive regions (which are not shown either). Alternatively, the chips 13 may not be metallized at the rear and each may have two or more chip pads 38 coupled to respective intermediate pads 53. In this case, the chips 13 are bonded to the intermediate substrate 50 by means of insulating material, in a conventional manner. Moreover conductive paths (not shown) are provided on the intermediate substrate 50 and couple the intermediate pads 53 and the possible pads underneath the chips 13 to peripheral pads 54. In turn, the peripheral pads 54 are coupled to wire-bonding pads 35 formed in the chip coupling level 20 through intermediate-coupling wires 55. Here, the solder-mask layer 40 electrically insulates the wire-bonding pads and the intermediate substrate 50 with respect to each other. Also in this case, the thickness of the encapsulating layer 14 is such that the space above the bonding wires 34 is approximately 50-100 μm and thus approximately between 150 and 600 μm, typically approximately between 400 and 450 μm above the intermediate substrate, and is thicker only in the narrow edge area, where the wire-bonding pads 35 are present.

Figure 9:
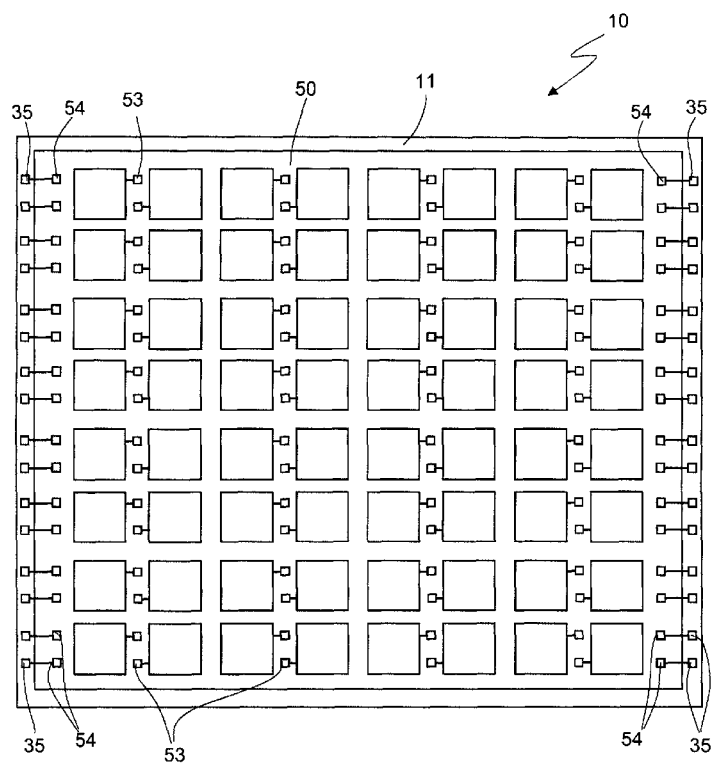
FIG. 9 shows a possible layout of the encapsulated photomultiplier device of FIG. 8 according to an embodiment.

The embodiment of FIG. 8 can be used for example with the layout of FIG. 9. Alternatively, the layout of FIG. 6 could be used.

The embodiment of FIG. 8 may have the advantage that the reference for positioning the chips can be provided on the intermediate silicon substrate 50, and thus with a lower tolerance as compared to the embodiments of FIGS. 4-7. In this way, it may be possible to further reduce the space between the chips 13 and thus optimize still further the occupation of area.

In this case, the manufacturing process differs from the one described above with reference to FIG. 4 in that the chips 13 are initially bonded on the intermediate substrate 50 and then the wire couplings 34 are provided; next, the intermediate substrate 50 with the chips 13 is bonded by the insulating adhesive layer 51 to the base substrate 11, and the intermediate-coupling wires 55 are provided.

Figure 10:
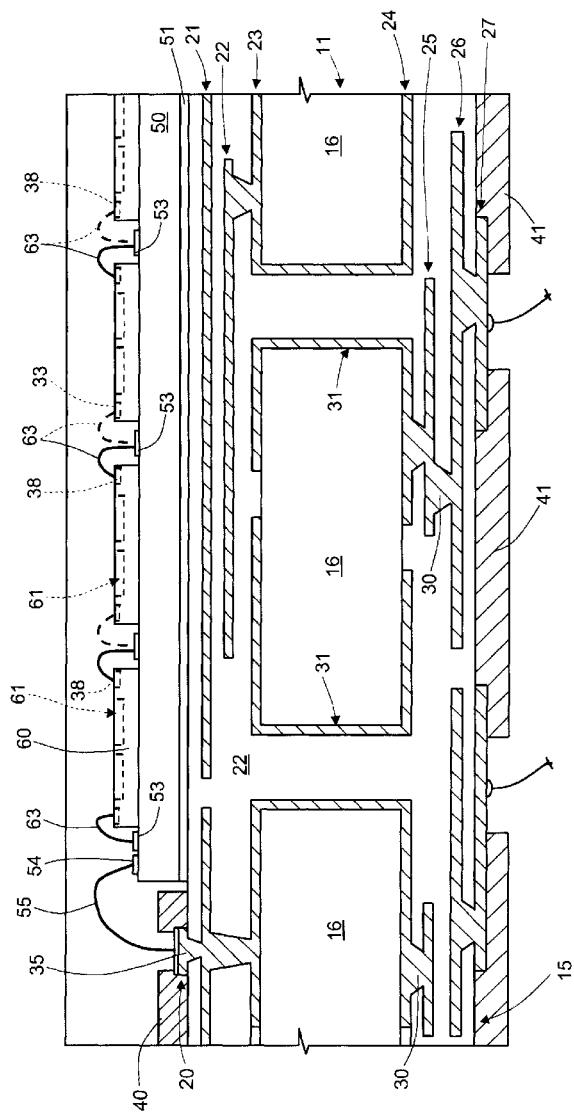
FIG. 10 shows a cross-section through another embodiment of an encapsulated photomultiplier device.
Figure 11:
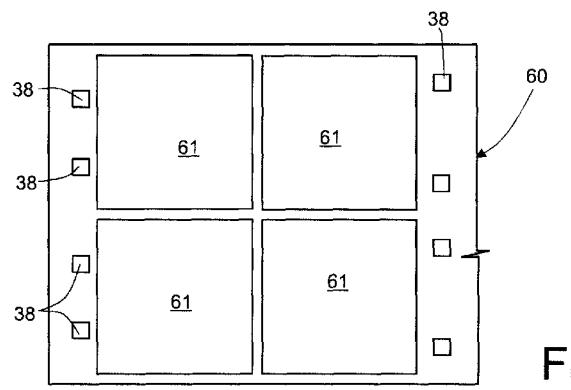
FIG. 11 shows a possible layout of a chip housing four active areas, which can be used with the photomultiplier device of FIG. 10, according to an embodiment.
Figure 12:
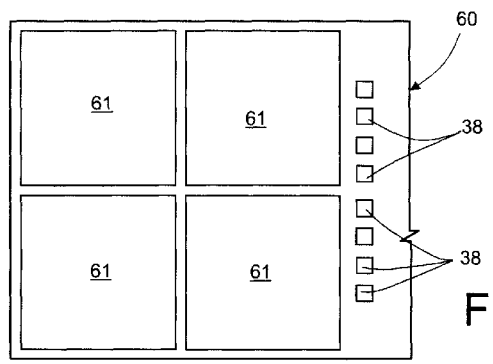
FIG. 12 shows a different layout of the chip that can be used with the photomultiplier device of FIG. 10 according to an embodiment.

In the embodiments of FIGS. 10-12, each chip 60 houses four photomultiplier cells of the type shown schematically in FIG. 3. In particular, each chip 60 has four active areas 61, electrically insulated from one another in a conventional manner (e.g., by junction or trench insulation).

Since four active areas 61 are integrated in a same body of semiconductor material (chip 60), no metallization is present on the rear side of the chip 60, as in the embodiments of FIGS. 8 and 9. Consequently, on each chip 60 eight chip pads 38 are provided coupled via respective coupling wires 63 (FIG. 10) to corresponding pads 53 formed on the intermediate substrate 50, similarly to FIG. 8.

FIGS. 11 and 12 differ only as regards the position of the chip pads 38: in FIG. 11, the chip pads 38 are arranged close to the respective active area, on the edges of the chip 60; in FIG. 12 all the chip pads 38 of the active areas are arranged along a same edge of the chip 60. In the latter case, on the surface of the chip 60, paths are provided, arranged between the active areas 61 so as to couple the two furthest active areas 61 to the chip pads 38.

An embodiment of a process for manufacturing the photomultiplier device 10 of FIGS. 10-12 is similar to the one described for the embodiments of FIGS. 8-9 but without rear metallization.

Figure 13:
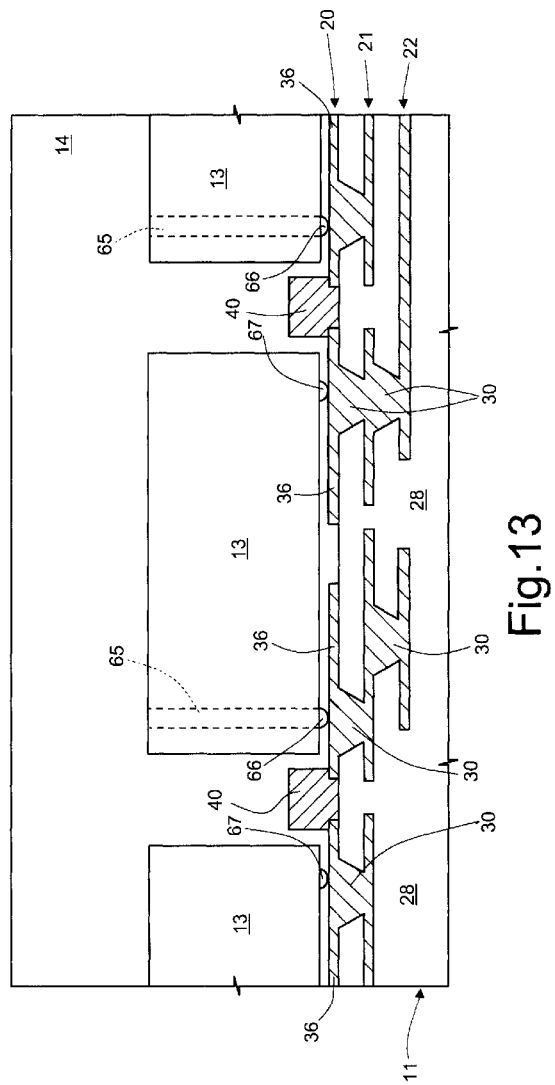
FIG. 13 shows a cross-section of an enlarged detail of a different embodiment of an encapsulated photomultiplier device.

FIG. 13 shows an embodiment wherein the chips 13, which each have integrated thereon a single photomultiplier cell 8, are coupled to the substrate 11 (or the intermediate substrate 50 if present) by through vias.

In this case, the chips 13 have internal through vias, represented by dashed lines and designated by 65 in FIG. 13, which contact respective bumps 66 on the rear side of each chip. For example, each chip 13 has two through vias 65 (just one whereof is represented schematically), arranged diametrically and symmetrically with respect to the chip 13 and coupled to as many bumps 66 (only one whereof is visible for each chip 13). For reasons of stability, on the rear side of each chip 13 another two auxiliary bumps 67 are formed (only one whereof is visible), which, however, are not electrically coupled to other elements and have the sole purpose of forming, with the bumps 66, four resting points for each chip 13.

The bumps 66, 67 are bonded to upper pads 36 formed in the chip coupling level 20; in particular, in this case, at least two upper pads 36 are provided for each chip (one for each bump 66 coupled to a respective through via 65). For the remaining portions of the device 10, the structure is similar to the one shown in FIG. 4.

Also in this case, the thickness of the encapsulating layer 14 is such that the space above the chips 13 is typically approximately between 150 and 200 μm, so that, in case of chips 13 having a thickness of approximately 250 μm, the thickness of the encapsulating layer 14, above the solder-mask layer 40, is typically approximately between 400 and 450 μm.

Such an embodiment enables further reduction of the dead areas due to the presence of the wire-bonding pads, thus increasing the percentage of active area with respect to the total surface of the photomultiplier device 10.

Such an embodiment provides for through silicon vias (TSVs) made through the chips 13 during machining thereof, in a conventional manner.

Figure 14:
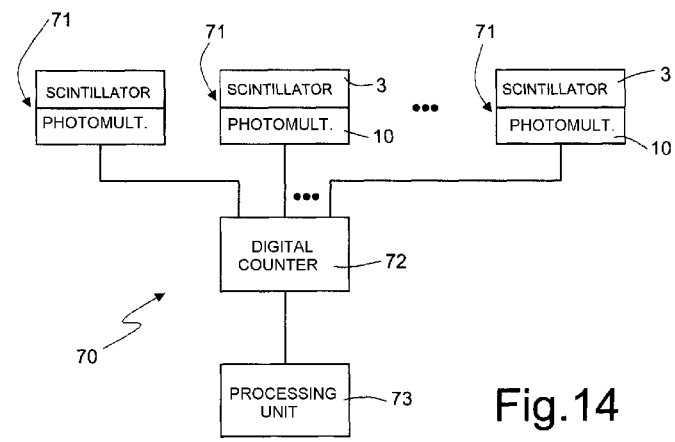
FIG. 14 shows a system for detecting images of a PET type incorporating one or more embodiments of a photomultiplier device.

An embodiment of the above-described photomultiplier device 10 can be used in an image-detecting system 70 of a PET type, shown schematically in FIG. 14 and including a plurality of detector blocks 71, a digital counter 72, and a controller such as a processing unit 73.

Each detector block 71 includes a photomultiplier device 10, according to, for example, embodiments described in conjunction with any of FIGS. 4-13, and a scintillator crystal 18, bonded to the encapsulating layer 14. The digital counter 72 is coupled to the photomultiplier devices 10 through couplings coupled to the pads in the external coupling level 27 and supplies the result of the counts to a processing unit 73, for example integrated together with the digital counter in an ASIC, so as to process the data received and reconstruct the image of the examined structures, possibly with the aid of an external computer.

An embodiment of the photomultiplier device 10 described herein may have numerous advantages.

For example, encapsulation with the silicone layer 14 enables protection of the chips 13, 60 during handling, transport, and storage of the photomultiplier device 10. Since the silicone material is transparent at the considered operating wavelengths, it does not interfere with operation of the photomultiplier cells integrated in the chips 13, 60 and bestows, together with the base substrate 11, stiffness to the device. Warpage of the photomultiplier device 10 is thus prevented, which may not enable bonding of the device to the scintillator crystal 18, or in any case may prevent a suitable quality of adhesion, thus possibly jeopardizing operation of the image detecting system. On the other hand, the slight resilience of the encapsulating layer 14 enables a sufficient adaptation thereof to any possible imperfections of the scintillator crystal 18.

The use of the silicone material does not cause stress on the chips 13, 60 at the considered operating temperatures, in view also of the low levels of operating current.

The chips 13 can be assembled in the photomultiplier device 10 so as to ensure reduced "dark" areas, i.e., a high ratio between the useful and the total area of the device, thus improving the efficiency of detection of the detection system that incorporates it.

In addition, it may be possible to generate current paths of substantially the same length for the signals generated in the chips 13 as far as the couplings on the external coupling level 27. The structure of the base substrate 11 also enables a shielding of the routing paths and thus low levels of noise to be achieved.

Finally, it is clear that modifications and variations may be made to the photomultiplier device described and illustrated herein without thereby departing from the scope of the present disclosure.

For example, using suitable design techniques, it may be possible to generate signal paths within the base substrate 11 so that there are no intercouplings or cross-over points. In this case, the conductive levels or layers 20-27 may be reduced to six, with the elimination of the first routing level 22 or the second routing level 25 and one shielding level 23, 24 or 26.

In addition, when four active areas 61 are integrated on a single chip 60, it may be possible to bond the multiple chips 60 directly on the base substrate 11, instead of using an intermediate substrate 50, by directly bonding the coupling wires 63 to the wire-bonding pads 35.

Finally, also an embodiment where the multiple chip 60 accommodate a number of active areas 61 may be provided with through vias 65 and bumps 66, as described above in conjunction with FIG. 13.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A photomultiplier device, comprising a plurality of chips of semiconductor material, each chip integrating a plurality of photon detecting elements, the chips being attached to a base substrate of an insulating organic material forming a plurality of conductive paths and being covered by a transparent encapsulating layer of a silicone resin;
   wherein the encapsulating layer has a thickness of approximately 100 to 250 μm, and a Young's module of approximately 2 to 10 Mpa.

2. A photomultiplier device according to claim 1, wherein the chips have a beveled corner and the chips are arranged in groups of four chips having respective beveled corners facing toward a same reference formed on the base substrate.

3. A photomultiplier device according to claim 1, wherein the encapsulating layer has a transparency to light higher than 90% at light wavelengths approximately between 400 and 800 nm.

4. A photomultiplier device according to claim 1, wherein the encapsulating layer is of a material selected among resin OE-6635A/B, resin LPS3412 and resin LPS5400.

5. A photomultiplier device according to claim 1, wherein the base substrate includes a core layer of insulating material, a first stack of conductive layers and of insulating layers, formed on a first side of the core layer and a second stack of conductive layers and of insulating layers, formed on a second side of the core layer, adjacent conductive layers in the first and in the second stacks being mutually spaced by the insulating layers and being coupled to each other by interlevel conductive vias and the first and the second stacks being electrically coupled by conductive through vias extending across the core layer.

6. A photomultiplier device according to claim 5, wherein the core layer is of a plastic, for example BT or FR-4.

7. A photomultiplier device according to claim 1, wherein the base substrate comprises a plurality of references and the chips are arranged in groups of four chips having respective corners facing a same reference.

8. A photomultiplier device, comprising a plurality of chips of semiconductor material, each chip integrating a plurality of photon detecting elements, the chips being attached to a base substrate of an insulating organic material forming a plurality of conductive paths and being covered by a transparent encapsulating layer of a silicone resin;
   wherein the base substrate includes a core layer of insulating material, a first stack of conductive layers and of insulating layers, formed on a first side of the core layer and a second stack of conductive layers and of insulating layers, formed on a second side of the core layer, adjacent conductive layers in the first and in the second stacks being mutually spaced by the insulating layers and being coupled to each other by interlevel conductive vias and the first and the second stacks being electrically coupled by conductive through vias extending across the core layer; and
   wherein the first stack includes, mutually overlapping, at least one chip coupling layer and a first shielding layer contiguous with the core layer; and the second stack includes, mutually overlapping, at least one second shielding layer contiguous with the core layer and an external coupling layer, at least one stack between the first and the second stacks including a routing layer arranged between a pair of shielding layers.

9. A photomultiplier device according to claim 8, wherein the chip coupling layer forms wire pads coupled to the chips through coupling wires.

10. A photomultiplier device according to claim 9, wherein the chip coupling layer forms upper pads and the chips are bonded to the upper pads through a conductive adhesive layer.

11. A photomultiplier device according to claim 9, further including an intermediate substrate of semiconductor material, the intermediate substrate being bonded to the first stack and the chips being bonded to the intermediate substrate.

12. A photomultiplier device according to claim 9, wherein the chips have through vias coupled to bumps formed on a main surface of the chips, and the bumps are coupled to upper pads formed in the chip coupling layer of the first stack.

13. An apparatus, comprising:
integrated circuits each including at least one respective photomultiplier cell that is sensitive to an electromagnetic wave having a wavelength; and
a layer having a Young's module of approximately 2 to 10 Mpa and a thickness of approximately 100 to 250 μm disposed over the integrated circuits and being at least partially transparent to an electromagnetic wave having the wavelength.

14. The apparatus of claim 13 wherein at least one of the respective photomultiplier cells includes an avalanche diode.

15. The apparatus of claim 13 wherein at least one of the respective photomultiplier cells is sensitive to a photon of an electromagnetic wave having the wavelength.

16. The apparatus of claim 13 wherein the wavelength is within a range of approximately 400 nanometers to approximately 800 nanometers.

17. The apparatus of claim 13 wherein the layer includes silicone.

18. The apparatus of claim 13 wherein the layer is resilient.

19. The apparatus of claim 13, further including:
wherein the integrated circuits are arranged in rows and columns; and
at least one signal conductor disposed between at least one pair, but not all pairs, of the columns.

20. The apparatus of claim 13, further including:
wherein the integrated circuits are arranged in rows and columns; and
at least one signal conductor disposed between at least one pair, but not all pairs, of the rows.

21. The apparatus of claim 13, further including:
wherein the integrated circuits are arranged in rows and columns including at least one end column having an outer side; and
at least one signal conductor disposed adjacent to the outer side of the end column.

22. The apparatus of claim 13, further including:
wherein the integrated circuits are arranged in rows and columns including at least one end row having an outer side; and
at least one signal conductor disposed adjacent to the outer side of the end row.

23. The apparatus of claim 13, further including:
wherein the integrated circuits are arranged in rows and columns; and
at least one signal conductor disposed between adjacent corners of at least three of the integrated circuits.

24. The apparatus of claim 13,
wherein the integrated circuits are arranged in rows and columns; and
at least one signal conductor disposed between adjacent corners of at least three of the integrated circuits, at least one of the adjacent corners having a bevelled edge.

25. The apparatus of claim 13, further including a substrate:
disposed beneath the integrated circuits;
including a first surface facing the integrated circuits and a second surface opposite the first surface;
at least one first signal conductor accessible from the first surface and coupled to at least one of the integrated circuits;
at least one second signal conductor accessible from the second surface; and
at least one conductive via disposed in the substrate between the at least one first signal conductor and the at least one second signal conductor.

26. The apparatus of claim 13, further including a substrate to which the integrated circuits are directly attached.

27. The apparatus of claim 13, further including:
a first substrate to which the integrated circuits are attached; and
a second substrate to which the first substrate is attached.

28. The apparatus of claim 13, further including a scintillator disposed over the layer.

29. An apparatus, comprising:
an organic substrate; and
integrated circuit chips each directly attached to the substrate and each including at least one respective photomultiplier cell;
wherein the organic substrate includes a core layer of mutating material, a first stack of conductive layers and of insulating layers, formed on a first side of the core layer and a second stack of conductive layers and of insulating layers, formed on a second side of the core layer, adjacent conductive layers in the first and in the second stacks being mutually spaced by the insulating layers and being coupled to each other by interlevel conductive vias and the first and the second stacks being electrically coupled by conductive through vias extending across the core layer; and
wherein the first stack includes, mutually overlapping, at least one chip coupling layer and a first shielding layer contiguous with the core layer; and the second stack includes, mutually overlapping, at least one second shielding layer contiguous with the core layer and an external coupling layer, at least one stack between the first and the second stacks including a routing layer arranged between a pair of shielding layers.

30. The apparatus of claim 29 wherein the organic substrate includes a circuit board.

31. The apparatus of claim 29 wherein the organic substrate includes a plastic.

32. The apparatus of claim 29, further including:
wherein each of the photomultiplier cells is sensitive to a wavelength of electromagnetic energy; and
a layer disposed over the integrated circuits and being at least partially transmissive to the wavelength of electromagnetic energy.

33. A system, comprising:
at least one photomultiplier device including:
integrated circuits each including at least one respective photomultiplier cell that is sensitive to an electromagnetic wave having a wavelength; and
a layer having a Young's module of approximately 2 to 10 Mpa and a thickness of approximately 100 to 250 μm disposed over the integrated circuits and being at least partially transparent to an electromagnetic wave having the wavelength; and
a controller coupled to the at least one photomultiplier device.

34. The system of claim 33, further including a scintillator disposed over the layer.

35. A system, comprising:
at least one photomultiplier device including:
an organic substrate;
integrated circuit chips each directly attached to the substrate and each including at least one respective photomultiplier cell;
a controller coupled to the at least one photomultiplier device; and
wherein the organic substrate includes a core layer of insulating material, a first stack of conductive layers and of insulating layers, formed on a first side of the core layer and a second stack of conductive layers and of insulating layers, formed on a second side of the core layer, adjacent conductive layers in the first and in the second stacks being mutually spaced by the insulating layers and being coupled to each other by interlevel conductive vias and the first and the second stacks being electrically coupled by conductive through vias extending across the core layer; and
wherein the first stack includes, mutually overlapping, at least one chip coupling layer and a first shielding layer contiguous with the core layer; and the second stack includes, mutually overlapping, at least one second shielding layer contiguous with the core layer and an external coupling layer, at least one stack between the first and the second stacks including a routing layer arranged between a pair of shielding layers.

36. The system of claim 35, further including:
wherein each of the photomultiplier cells is sensitive to a wavelength of electromagnetic energy;
a layer disposed over the integrated circuit chips and being at least partially transparent to the wavelength of electromagnetic energy; and
a scintillator disposed over the layer.

37. A method, comprising:
forming integrated circuits each including at least one respective photomultiplier cell that is sensitive to an electromagnetic wave having a wavelength; and
forming over the integrated circuits a layer having a Young's module of approximately 2 to 10 Mpa and a thickness of approximately 100 to 250 μm that is at least partially transparent to an electromagnetic wave having the wavelength.

38. The method of claim 37, further including:
wherein forming the integrated circuits includes forming the integrated circuits on a wafer; and
dicing arrays of the integrated circuits from the wafer after forming the layer.

39. The method of claim 37, further including attaching the integrated circuits to a support substrate.

* * * * *

UNITED STATES PATENT AND TRADEMARK OFFICE
CERTIFICATE OF CORRECTION

| | | |
|---|---|---|
| PATENT NO. | : 9,188,683 B2 | |
| APPLICATION NO. | : 13/303731 | |
| DATED | : November 17, 2015 | |
| INVENTOR(S) | : Shaw et al. | |

It is certified that error appears in the above-identified patent and that said Letters Patent is hereby corrected as shown below:

In the claims
Column 12, Line 28, claim 29:
"mutating material, a first stack of conductive layers and" should read, --insulating material, a first stack of conductive layers and--.

Signed and Sealed this
Twenty-first Day of June, 2016

Michelle K. Lee
*Director of the United States Patent and Trademark Office*